(12) United States Patent
Bader

(10) Patent No.: US 12,397,510 B2
(45) Date of Patent: Aug. 26, 2025

(54) METHOD AND DEVICE FOR PRODUCING AN ADHESIVE BOND BETWEEN A FIRST COMPONENT AND A SECOND COMPONENT

(71) Applicant: Carl Zeiss SMT GmbH, Oberkochen (DE)

(72) Inventor: Dieter Bader, Goeggingen (DE)

(73) Assignee: CARL ZEISS SMT GMBH, Oberkochen (DE)

(*) Notice: Subject to any disclaimer, the term of this patent is extended or adjusted under 35 U.S.C. 154(b) by 354 days.

(21) Appl. No.: 17/565,655

(22) Filed: Dec. 30, 2021

(65) Prior Publication Data

US 2022/0118715 A1 Apr. 21, 2022

Related U.S. Application Data

(63) Continuation of application No. PCT/EP2020/066079, filed on Jun. 10, 2020.

(30) Foreign Application Priority Data

Jul. 1, 2019 (DE) .................. 10 2019 209 610.7

(51) Int. Cl.
*B29C 65/48* (2006.01)
*B29C 65/00* (2006.01)
(Continued)

(52) U.S. Cl.
CPC .............. *B29C 65/48* (2013.01); *B29C 66/95* (2013.01); *G02B 27/62* (2013.01);
(Continued)

(58) Field of Classification Search
None
See application file for complete search history.

(56) References Cited

U.S. PATENT DOCUMENTS 4,332,636 A 6/1982 McLeod
2004/0233553 A1 11/2004 Shibata et al.
(Continued)

FOREIGN PATENT DOCUMENTS

CN 1969217 A 5/2007
CN 102431272 A 5/2012
(Continued)

OTHER PUBLICATIONS

DE 102018201981 machine translation (Year: 2018).*
(Continued)

*Primary Examiner* — Barbara J Musser
(74) *Attorney, Agent, or Firm* — Edell, Shapiro & Finnan, LLC

(57) ABSTRACT

Method and device for producing an adhesive bond between a first component and a second component (optical element) for microlithography. The method involves: introducing the first and second components into a positioning device for changing the relative position between the first and second components, calibrating a first relative position, in which a distance between the first and second components has a first value defining a predefined adhesive gap, calibrating a second relative position, in which a distance between the first and second components has a second value greater than the first value, applying adhesive to the first component while the first and second components are at a distance greater than the first value, and setting the first relative position while forming the adhesive bond between the first and second components. Calibrating the first and second relative positions are carried out before the adhesive is applied to the first component.

16 Claims, 11 Drawing Sheets

(51) Int. Cl.
  *B29L 11/00* (2006.01)
  *G02B 27/62* (2006.01)
  *G03F 7/00* (2006.01)
(52) U.S. Cl.
  CPC .......... *B29L 2011/0016* (2013.01); *B29L 2011/0058* (2013.01); *G03F 7/70266* (2013.01)

(56) References Cited

U.S. PATENT DOCUMENTS

| | | | |
|---|---|---|---|
| 2006/0192328 | A1 | 8/2006 | Morrison et al. |
| 2007/0047876 | A1 | 3/2007 | Kwan et al. |
| 2007/0281149 | A1 | 12/2007 | Martens et al. |
| 2008/0100899 | A1 | 5/2008 | Shimokawa et al. |
| 2012/0082823 | A1 | 4/2012 | Chung et al. |
| 2013/0070356 | A1 | 3/2013 | Camet et al. |
| 2013/0120730 | A1 | 5/2013 | Hartjes |
| 2017/0192360 | A1 | 7/2017 | Prochnau et al. |

FOREIGN PATENT DOCUMENTS

| | | | |
|---|---|---|---|
| CN | 105551930 | A | 5/2016 |
| DE | 102006043185 | A1 | 4/2008 |
| DE | 102016214481 | A1 | 9/2016 |
| DE | 102017219754 | A1 | 1/2018 |
| DE | 102018201981 | A1 | 3/2018 |
| DE | 102017216128 | A1 | 3/2019 |
| JP | 2004347753 | A | 12/2004 |
| JP | 2007329475 | A | 12/2007 |
| JP | 2015127048 | A | 7/2015 |

OTHER PUBLICATIONS

Japanese Office Action with English translation, Application No. 2021-577433, Mar. 5, 2024, 7 pages.
International Search Report, PCT/EP2020/066079, Oct. 7, 2020, 3 pages.
Written Opinion, PCT/EP2020/066079, Oct. 20, 2020, 9 pages.
German Office Action with English translation, Application No. 10 2019 209 610.7, Feb. 21, 2020, 6 pages.
Chinese Office Action with English translation, Application No. 202080047597.9, Feb. 26, 2025, 13 pages.
Chinese Office Action with English translation, Application No. 2020800475979, Jul. 8, 2025, 9 pages.

* cited by examiner

METHOD AND DEVICE FOR PRODUCING AN ADHESIVE BOND BETWEEN A FIRST COMPONENT AND A SECOND COMPONENT

CROSS REFERENCE TO RELATED APPLICATIONS

This is a Continuation of International Application PCT/EP2020/066079, which has an international filing date of Jun. 10, 2020, and which claims the priority of German Patent Application 10 2019 209 610.7, filed Jul. 1, 2019. The disclosures of both applications are incorporated in their respective entireties into the present Continuation by reference.

FIELD OF THE INVENTION

The invention relates to a method and a device for producing an adhesive bond between a first component and a second component for microlithography. The invention can serve in particular for producing an adhesive bond between an actuator and an optical element such as e.g. a mirror embodied as a component for microlithography. The invention furthermore relates to a method for producing a microlithographic projection exposure apparatus comprising an illumination device and a projection lens, wherein an adhesive bond between a first component and a second component is produced in the illumination device and/or in the projection lens.

BACKGROUND

Microlithography is used for producing microstructured components such as, for example, integrated circuits or liquid crystal displays (LCDs). The microlithography process is conducted in what is called a projection exposure apparatus, which comprises an illumination device and a projection lens. The image of a mask (=reticle) illuminated by the illumination device is projected here by the projection lens onto a substrate (e.g. a silicon wafer) coated with a light-sensitive layer (=photoresist) and disposed in the image plane of the projection lens, in order to transfer the mask structure to the light-sensitive coating of the substrate.

In projection lenses designed for the Extreme Ultraviolet (EUV) range, i.e., at wavelengths of, e.g., approximately 13 nm or approximately 7 nm, mirrors are used as optical components for the imaging process owing to the lack of availability of suitable light-transmissive refractive materials.

Both in systems designed for the EUV range and in Deep Ultraviolet (DUV) systems (i.e. at wavelengths of less than 250 nm, in particular less than 200 nm), it is known to configure optical components such as e.g. mirrors in an adaptive or actuatable fashion in order at least partly to compensate for imaging aberrations in the optical system, for example, by local deformation. For this purpose, in particular, one or more (e.g. piezoelectric) actuators can be fixed to the respective optical element, e.g. to the rear side thereof facing away from the optical effective surface, with adhesive bonds.

In the case of such adhesive bonds, a precise setting of the adhesive gap, which is desirable or necessary both for reasons of the service life of the adhesive bond and in order to avoid undesired optical aberrations in the optical system, constitutes a demanding challenge due to the high accuracy requirements in lithography applications. This is owing to the fact, inter alia, that the defined setting of the respective adhesive gap at the generally curved joining surfaces is made more difficult by diverse factors including, in particular, manufacturing-dictated geometry deviations of the joining surfaces, viscosity fluctuations of the adhesive and gravitation influences on, inter alia, the flow behaviour of the adhesive and the exact orientation of the components. An additional factor is that, in view of the high accuracy requirements, the introduction of mechanical stresses and deformations associated therewith in particular into the respective actuators or the relevant optical element must be reliably prevented.

SUMMARY

It is an object of the present invention to provide a method and a device for producing an adhesive bond between a first component and a second component for microlithography which enable a reliable and precise setting of the adhesive gap while at least partly avoiding the problems described above.

A method according to one formulation of the invention for producing an adhesive bond between a first component and a second component for microlithography, wherein the second component is an optical element, comprises:
  Introducing the first component and the second component into a positioning device, which makes it possible to change the relative position between first and second components;
  Calibrating a first relative position, in which a distance between first and second components has a first value defining a predefined adhesive gap;
  Calibrating a second relative position, in which a distance between first and second components has a second value, which is greater than the first value;
  Applying adhesive to the first component while first and second components are at a distance from one another which is greater than the first value; and
  Setting the first relative position while forming the adhesive bond between first and second components;
  wherein both calibrating the first relative position and calibrating the second relative position are carried out before applying the adhesive to the first component.

Even though hereinafter it is assumed by way of example that the first component is an actuator and the second component is an optical element e.g. in the form of a mirror, both components for microlithography, the invention is not restricted thereto. Rather, the invention is also advantageously able to be realized in other applications for microlithography which strive to achieve as reliable and precise setting of an adhesive gap as possible while at least partly avoiding the problems described in the introduction.

In the context of the requirements for microlithography, the present invention makes use of the concept, in particular, when producing an adhesive bond, of realizing the precise and controlled setting of an adhesive gap between a first component, such as e.g. an actuator, and a second component, such as e.g. an optical component. This precise and controlled setting is achieved by carrying out, in a positioning device that makes it possible to change the relative position of actuator and optical element with respect to one another before applying the adhesive to one of the joining surfaces, a calibration of relative positions between actuator and optical element both with regard to an end position corresponding to the adhesive gap distance ultimately desired, and with regard to a (start) position not yet corresponding to said end position. One of these calibration steps, which are carried out still without adhesive applied, is carried out typically at the beginning or still before the actuator has initially moved to the optical element, and the other calibration step (related to the calibration of the end position of the actuator relative to the optical element, said end position corresponding to the adhesive gap distance) is carried out after initial movement to the optical element. Afterwards, it is then possible, with the actuator again being at a relative large distance from the optical element, for the adhesive to be applied to the actuator and for the actuator finally to be moved from the calibrated start position to the optical element as far as the likewise calibrated end position corresponding to the adhesive gap distance.

Since the step mentioned last is carried out without the optical element being touched by the actuator and furthermore with (typically sensor-aided) control of the adhesive gap distance set, as a result a precise adhesive gap setting is realized in a controlled manner and while avoiding the introduction of mechanical stresses into the optical element via the actuator.

In accordance with one embodiment, calibrating the second relative position comprises measuring a position of a calibration element that is temporarily brought into contact with a surface of the first component.

In accordance with one embodiment, said calibration element has a geometry corresponding to a surface of the second component.

In accordance with one embodiment, calibrating the first and/or second relative position is carried out using at least one distance sensor, in particular an optical distance sensor.

In accordance with one embodiment, calibrating the first and/or second relative position comprises orienting the second component in six degrees of freedom.

In accordance with one embodiment, said orienting of the second component is carried out using at least one mechanical stop present in the positioning device.

In accordance with one embodiment, calibrating the first and/or second relative position comprises lateral orienting of the first component.

In accordance with one embodiment, said lateral orienting of the first component is carried out using at least one mechanical stop present in the positioning device.

In accordance with one embodiment, the first component comprises a plurality of partial surfaces, wherein in the course of applying the adhesive the metering of the adhesive is varied for mutually different partial surfaces taking account of a meniscus formation to be expected in edge regions of the respective partial surface.

In accordance with one embodiment, in the course of applying the adhesive, the adhesive is positioned taking account of the angular position between first and second components that is to be expected in an end position which is attained after the adhesive bond has been produced.

In accordance with one embodiment, the first component is an actuator.

In accordance with one embodiment, the second component is an optical element, in particular a mirror or a lens element.

The invention additionally relates to a method for producing a microlithographic projection exposure apparatus comprising an illumination device and a projection lens, wherein an adhesive bond between a first component and a second component in the illumination device and/or in the projection lens is produced by carrying out a method having the features described above.

In this case, in particular, the first component can be an actuator, and the second component can be, in particular, an optical element, more particularly a mirror or a lens element.

The invention also relates to a device for producing an adhesive bond between a first component and a second component for microlithography, wherein the device is configured for carrying out a method having the features described above.

Further configurations of the invention can be gathered from the description and the dependent claims.

The invention is explained in greater detail below on the basis of exemplary embodiments illustrated in the accompanying figures.

DETAILED DESCRIPTION

Embodiments of the method according to the invention are explained below with reference to the schematic depictions in FIGS. 1A-1E and FIGS. 2-3 and also the flow diagram shown in FIG. 4.

Figure 1A:
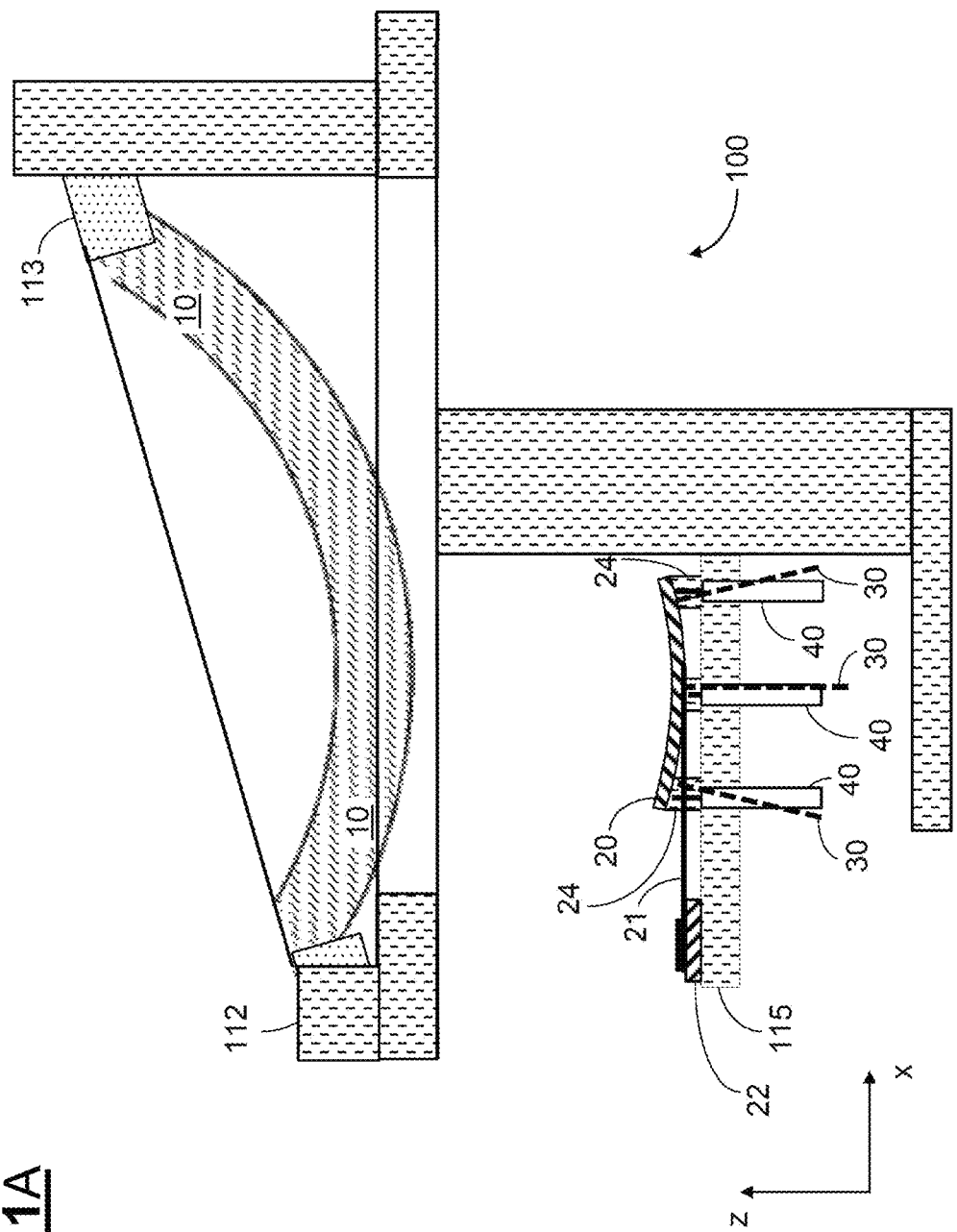
FIGS. 1A-1E show schematic illustrations for describing a possible sequence of a method according to the invention, including orientation and adjustment of the components (FIG. 1A), initiating calibration (FIG. 1B), calibrating a first relative position (FIG. 1C), moving the components to a relative position greater than the first relative position and applying adhesive (FIG. 1D), and setting the first relative position and allowing the adhesive to cure (FIG. 1E)
Figure 1B:
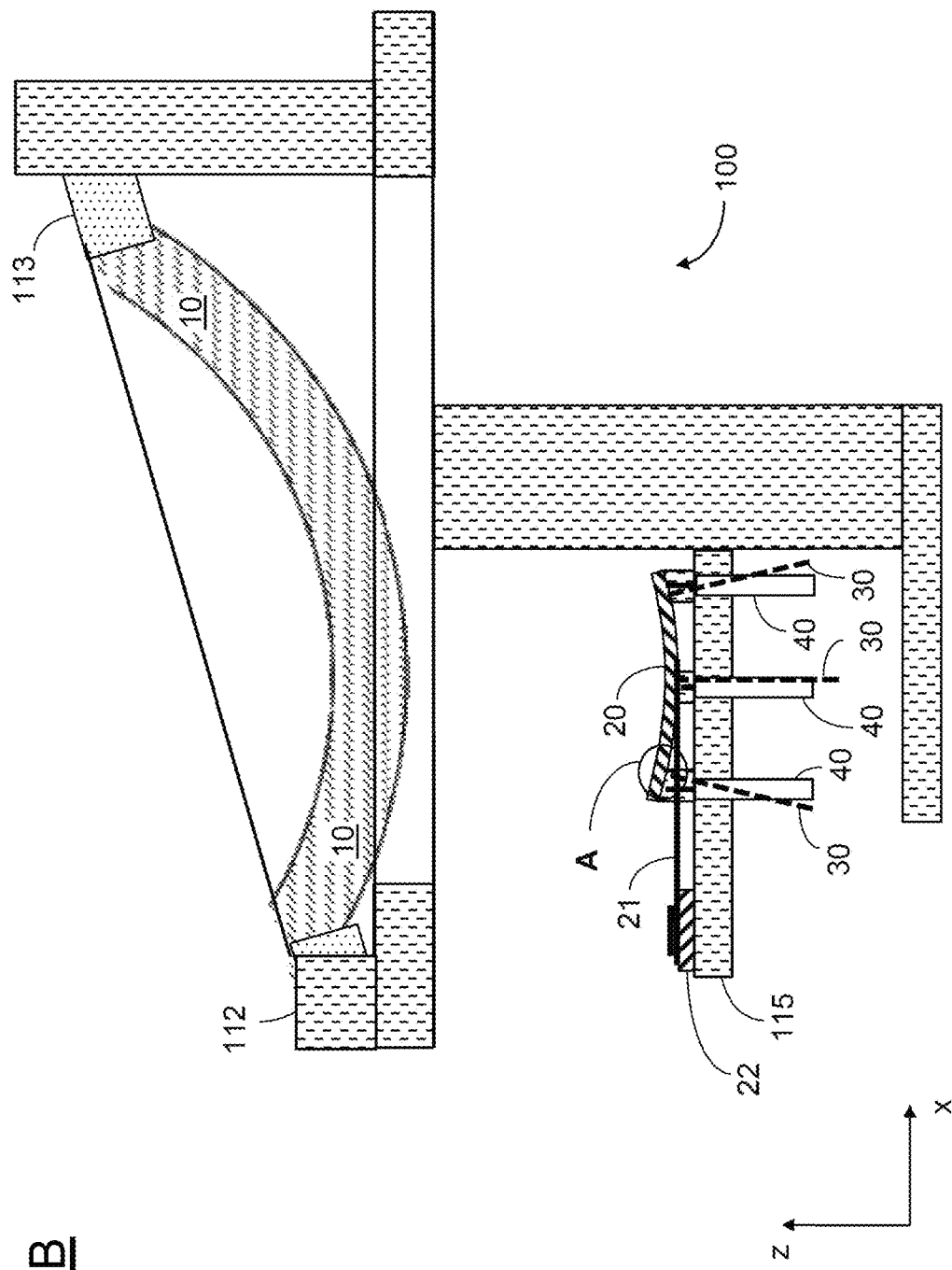

In accordance with FIG. 1A, the method is carried out in a positioning device 100, which, as described in greater detail below, makes possible both an orientation of the components (optical component 10, on the one hand, and actuator 20, on the other hand) to be joined to one another by way of an adhesive bond, and an adjustment of the relative position of said components with respect to one another. This involves carrying out, in accordance with FIG. 1A and steps S410 and S420 of FIG. 4, firstly a process of orienting the optical component 10 in six degrees of freedom e.g. using mechanical stops 112, 113, on the one hand, and laterally orienting the actuator 20, which is carried by a table 115 movable in the z-direction and is adjustable by way of adjusting devices 40 e.g. in the form of micrometre screws.

Reference numerals "21" and "22" denote connecting lines and contacts of the respective (e.g. piezoelectric) actuator 20. In accordance with FIG. 1A, in the exemplary embodiment, laterally orienting the actuator 20 is carried out by way of lateral mechanical stops 24.

The next step S430 involves calibrating a (z-)position of the actuator 20, which can serve as the start position in the later relative adjustment. Here the measurement technology mentioned below (e.g. confocal sensors) is "zeroed" in accordance with the actuator surface, and the position of a boundary surface for the later adhesive gap is defined. This calibration corresponding to "zeroing" of the z-position of the actuator 20 is carried out using any suitable measurement technology and, in the exemplary embodiment, with the aid of a confocal sensor 30 directed onto a reference surface 50a of a calibration element 50 in the form of a reference mirror. As can best be seen from FIG. 2, in the specific exemplary embodiment (but without the invention being restricted thereto) the measurement section of the confocal sensor 30 extends through a hole 23 situated within the actuator 20. The reference surface 50a of the calibration element 50, said reference surface bearing against the surface 20a of the actuator 20 during this calibration, has, for its part, a geometry corresponding to the surface of the optical element 10. By measuring the position of the reference surface 50a with the aid of the confocal sensor 30, the position of the surface 20a of the actuator 20 is also determined indirectly.

In further embodiments, the above-described calibration of the position of the actuator 20 can also be carried out using any other suitable (e.g. tactile) measurement technology or else using a coordinate measuring machine.

Figure 3:
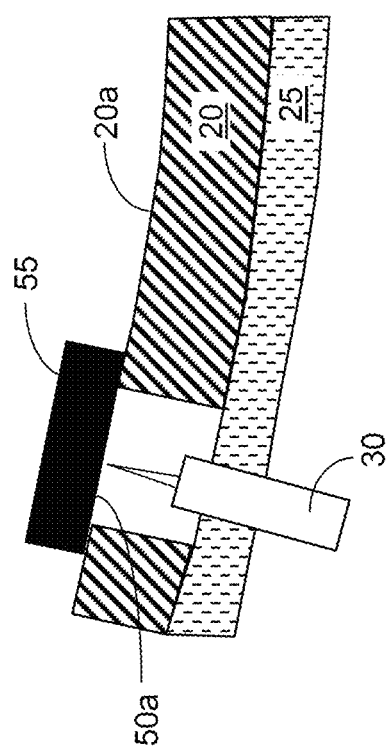

In accordance with FIG. 3, the calibration element (or the reference mirror) used in the above-described calibration of the position of the actuator 20 can also be configured with significantly reduced lateral dimensions, such that for instance in the exemplary embodiment illustrated in accordance with FIG. 3, a calibration element 55 projects precisely above the hole 23 that is present in the actuator 20 and is used by the confocal sensor 30. With the use of such a calibration element 55, accordingly, in contrast to the configuration in FIG. 2, the unevennesses or defects of form generally present on the surface 20a of the actuator 20 have no influence on the calibration. Furthermore, when carrying out two separate calibration steps, of which one is carried out using the larger calibration element 50 and the other using the smaller calibration element 55, it is also possible to determine said defects of form on the surface 20a of the actuator 20.

Figure 1C:
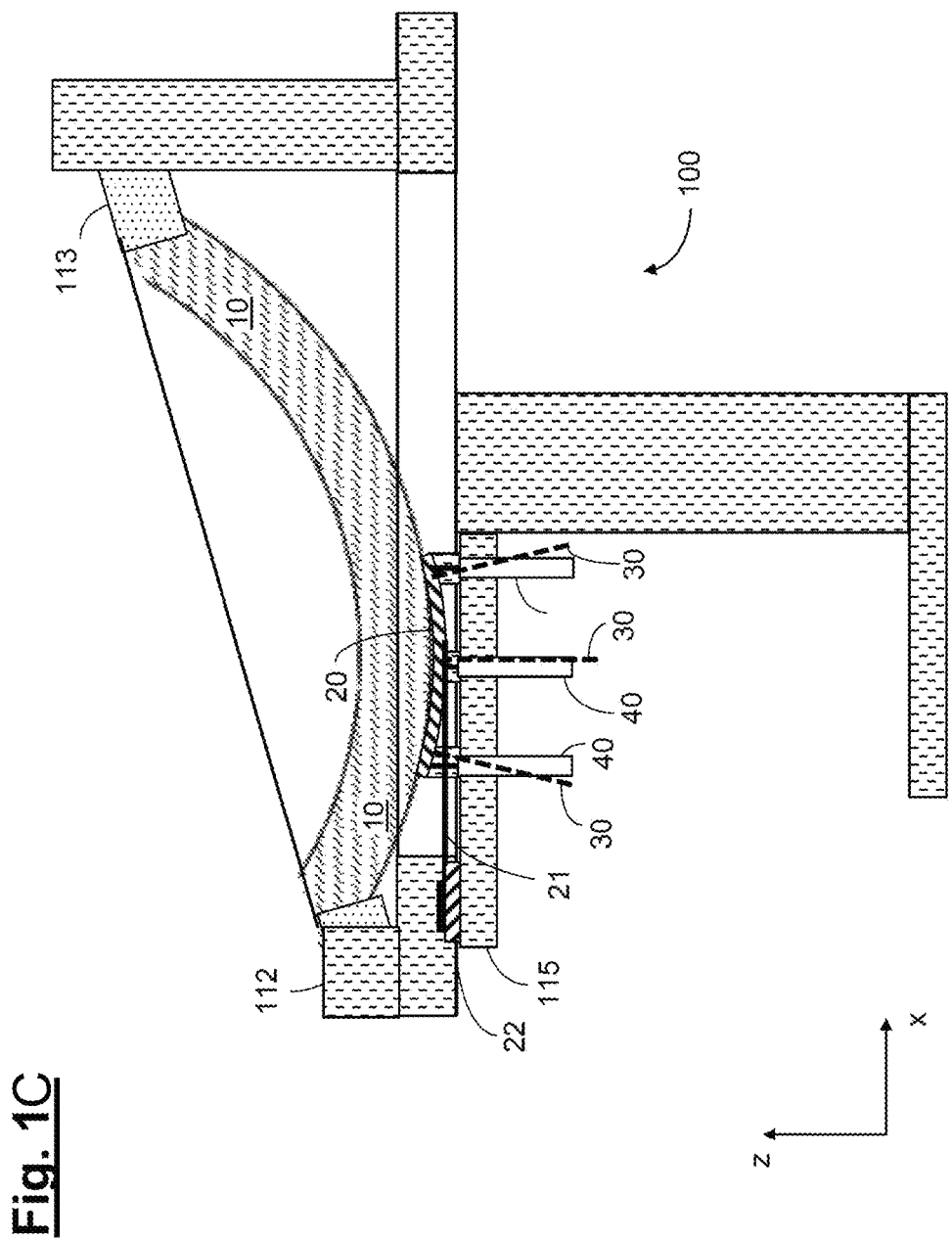
Figure 4:
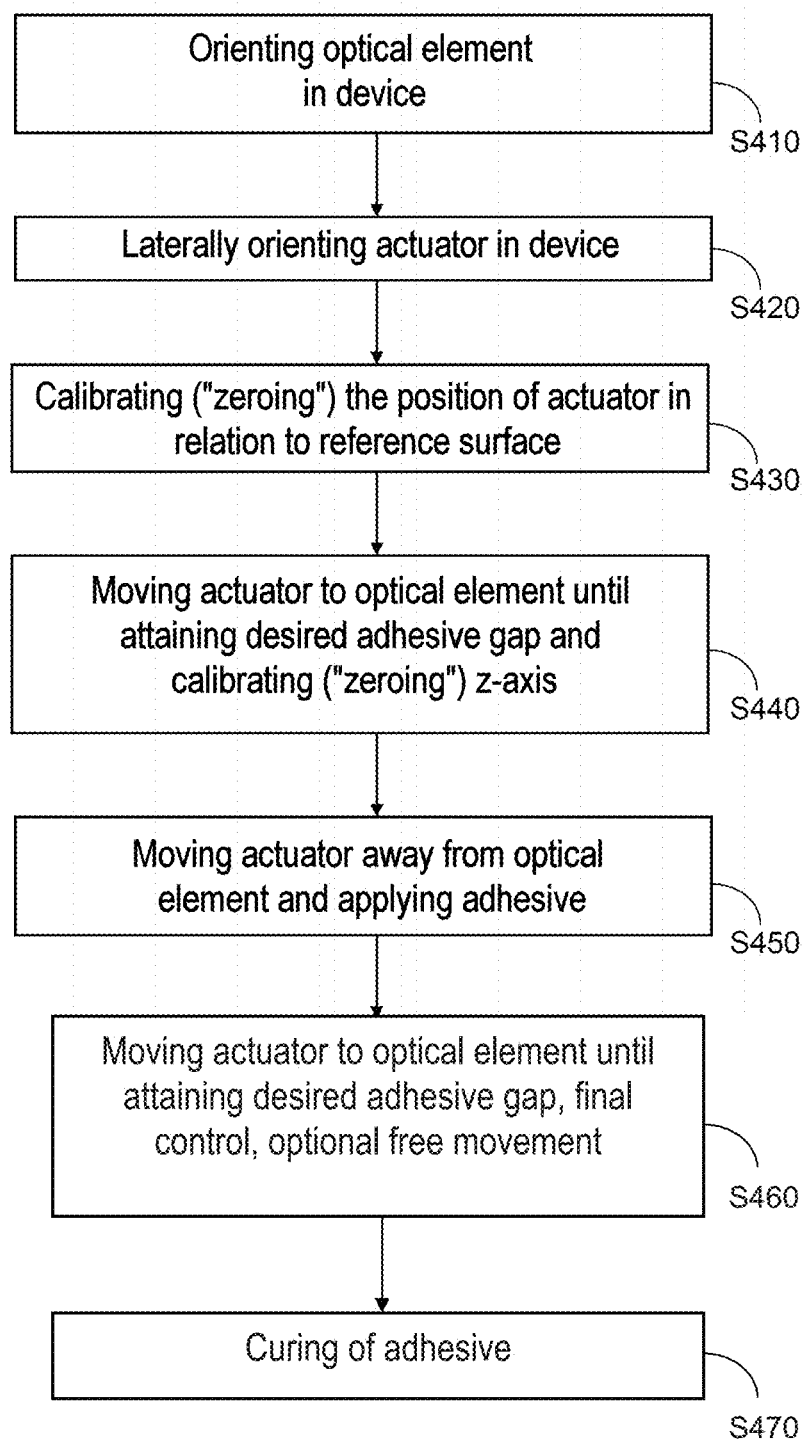
FIG. 4 shows a flow diagram for describing a sequence of the method according to the invention in one exemplary embodiment.

The next step S440 in accordance with FIG. 4 and also FIG. 1C then involves moving the actuator 20 to the optical element 10 until the desired adhesive gap (of just by way of example 100 μm) is attained, with the aid of the table 115 movable in the z-direction and preferably under control with the aid of the confocal sensors 30. In embodiments of the invention, the steps mentioned above can also be carried out for a plurality of actuators 20 to be fixed to the optical element 10 by an adhesive bond. After the desired adhesive gap distance has been attained, corresponding calibration of this z-position is once again carried out, whereupon the subsequent step S450 in accordance with FIG. 4 and FIG. 1D involves moving the actuator 20 away again from the optical element 10 and applying the adhesive 26 with a suitable device 25 on the surface of the actuator 20.

The further step S460 involves moving the actuator 20 again to the optical element 10 until the calibration position defined previously in accordance with the desired adhesive gap is reached, wherein fine control of the adhesive gap can once again be effected with the aid of the confocal sensors 30. The actual curing process (step S470) for the adhesive 26 can typically last a number of days. In this case, optionally after a suitable period of time (of e.g. 24 hours) within which the adhesive 26 has already cured and the actuator 20 has already been reliably fixed to the mirror 10, the table 115 movable in the z-direction can be lowered by a comparatively small distance (of e.g. 5 μm) in order, by way of such "free movement", to avoid the subsequent transfer of mechanical stresses from the actuator 20 via the adhesive 26 as far as the optical element 10.

Applying electric current to the (in particular piezoelectric) actuator 20 can likewise be carried out in step S460 and, for example, still before the optional free movement, but for safety reasons preferably after the fine positioning of the actuator.

In further embodiments, the (in particular piezoelectric) actuator can also have a plurality of partial surfaces, to which adhesive is applied in each case in step S450 in accordance with FIG. 4 in order to produce the adhesive bond. In this case, as indicated schematically in FIGS. 5A-5C, the amount of adhesive respectively applied can vary depending on the specific geometry, with the aim of obtaining a uniform meniscus formation at the respective edge surfaces with a defined adhesive gap.

Figure 5:
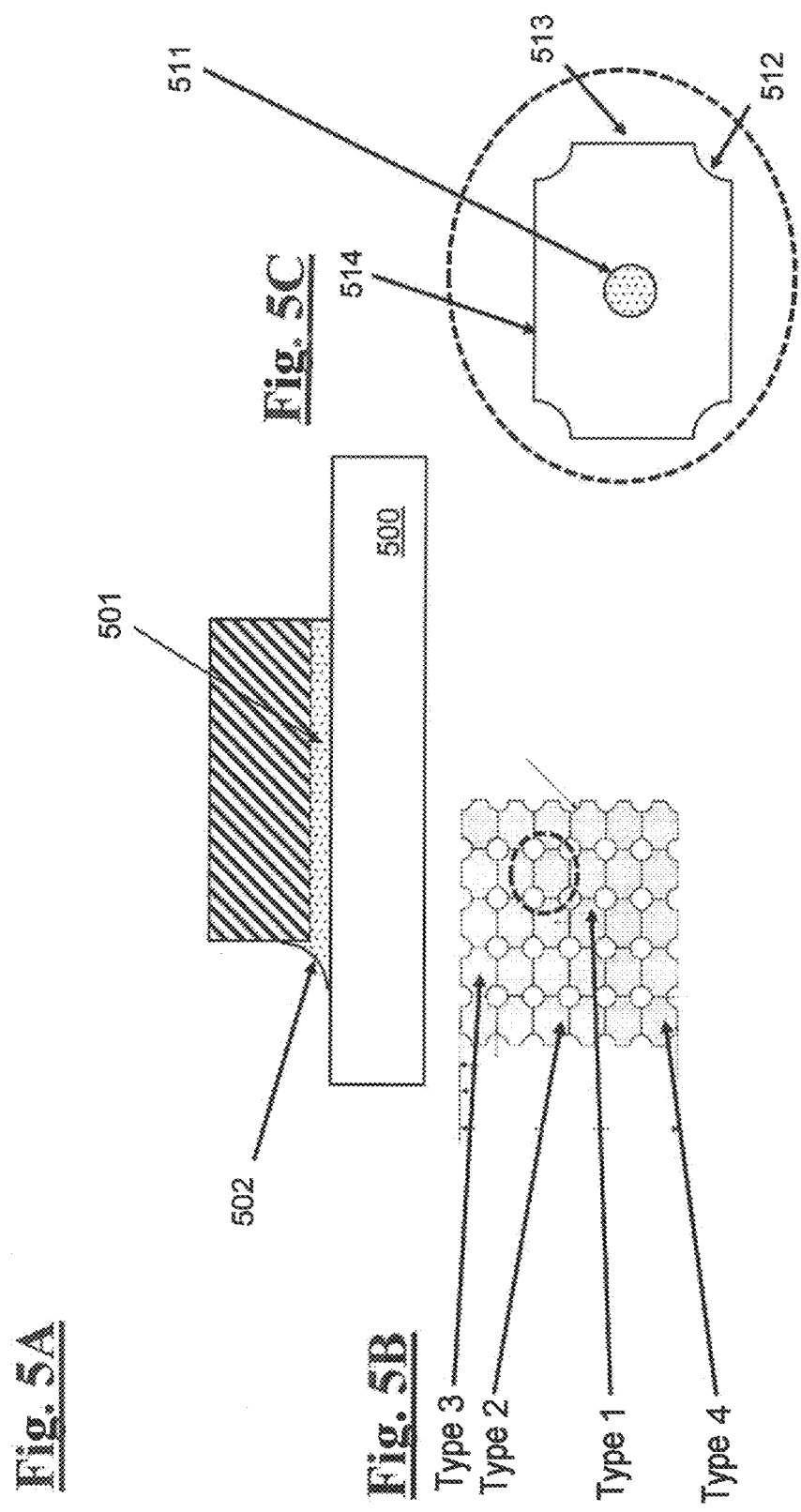
FIGS. 5A-5C show a further schematic illustration for describing advantageous configurations of the method according to the invention in cross-section (FIG. 5A), plan (FIG. 5B) and detail (FIG. 5C) views.

To that end, FIG. 5A firstly shows schematically between an actuator 501 and an optical element 500 the formation of an adhesive gap 501 with formation of a meniscus 502 at the edge region. In accordance with FIG. 5B, an actuator has different types of partial surfaces ("Type 1"-"Type 4"), which differ from one another with regard to the edge regions (circle segments or outer edges) in which a meniscus respectively forms in the course of the adhesive bond. In this regard, by way of example, for the ("inner") partial surface of "Type 1" illustrated schematically in FIG. 5C, a meniscus forms only at the four circle segments 512, but not at the shorter or longer outer edges 513, 514. By contrast, for the partial surfaces of "Type 2", a meniscus also forms at a shorter outer edge in addition to four circle segments; for the partial surfaces of "Type 3", a meniscus also forms at a longer outer edge in addition to four circle segments and for the partial surfaces of "Type 4", a meniscus also forms at a shorter outer edge and at a longer outer edge in addition to four circle segments. The amount of adhesive applied is thus preferably chosen to be smaller for the partial surfaces of "Type 1" than for the partial surfaces of "Type 2", and chosen to be smaller for the partial surfaces of "Type 2" and "Type 3" than for the partial surfaces of "Type 4", etc.

Figure 1D:
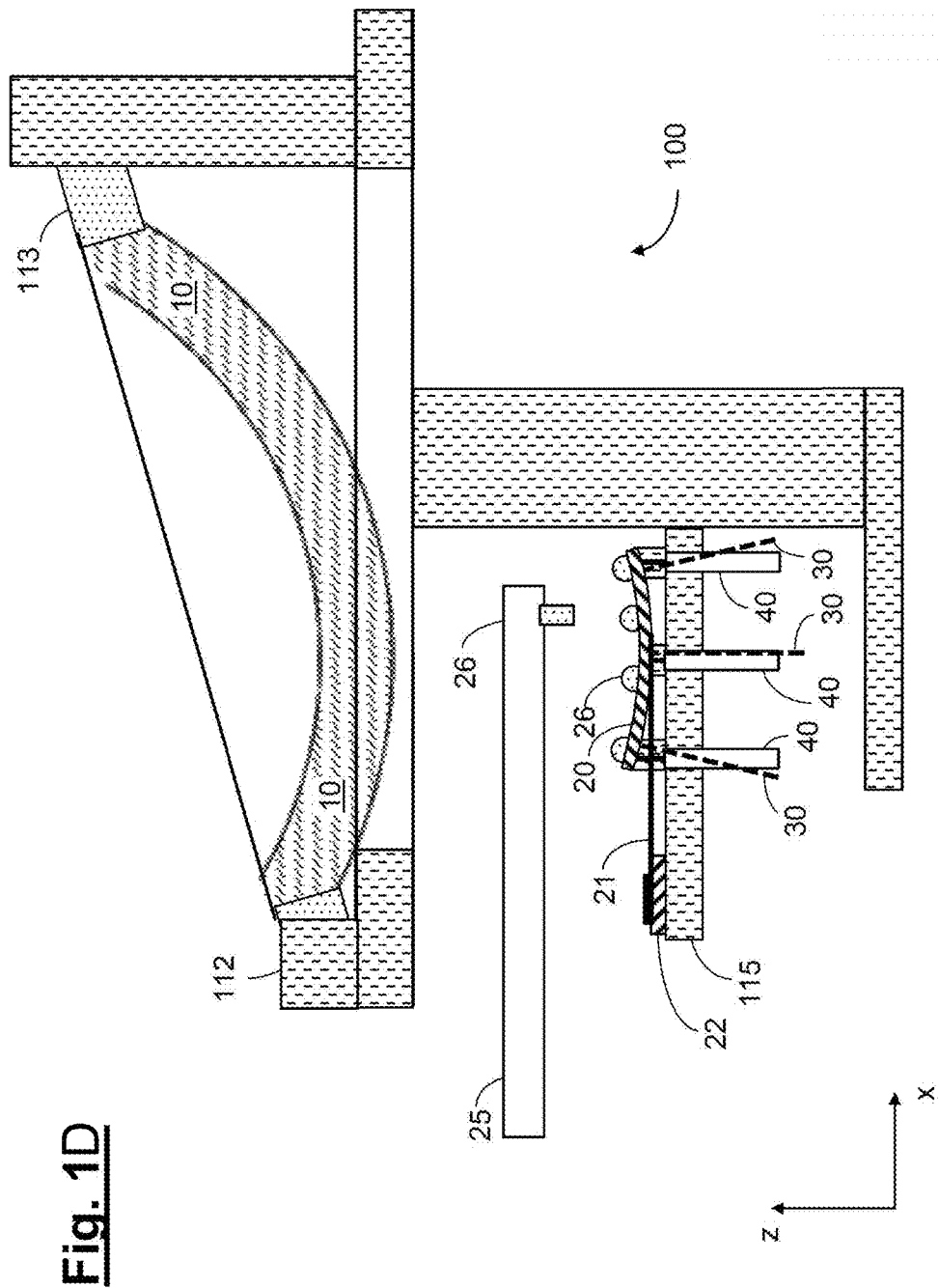
Figure 1E:
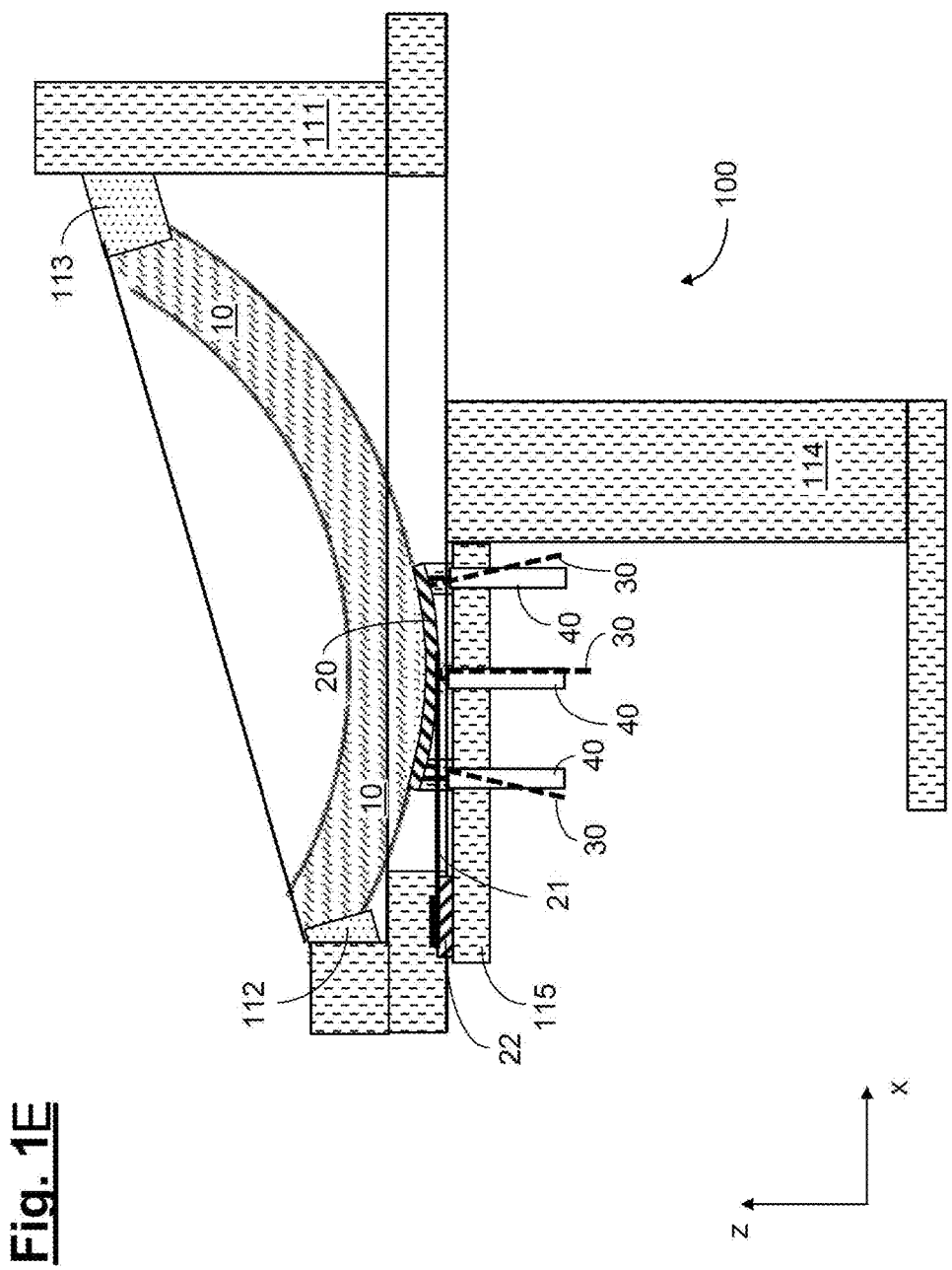
Figure 2:
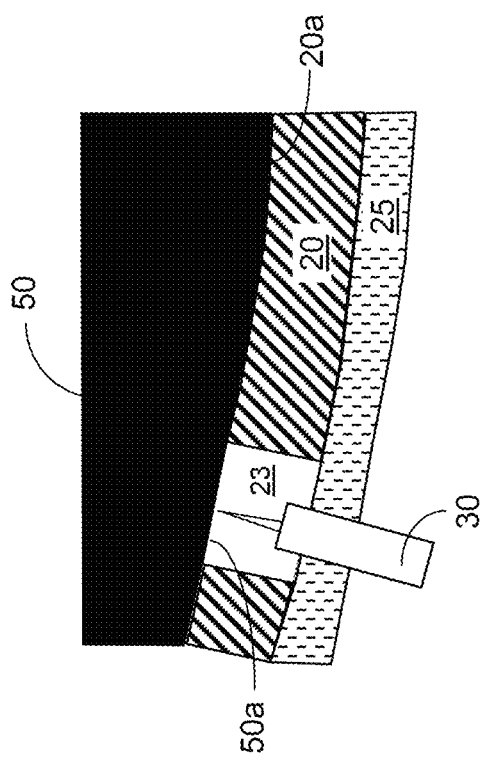
FIGS. 2-3 show schematic detail illustrations for more specifically describing possible calibration configurations using larger (FIG. 2) and smaller (FIG. 3) calibration elements for calibrating position in the region "A" in FIG. 1B.
Figure 6:
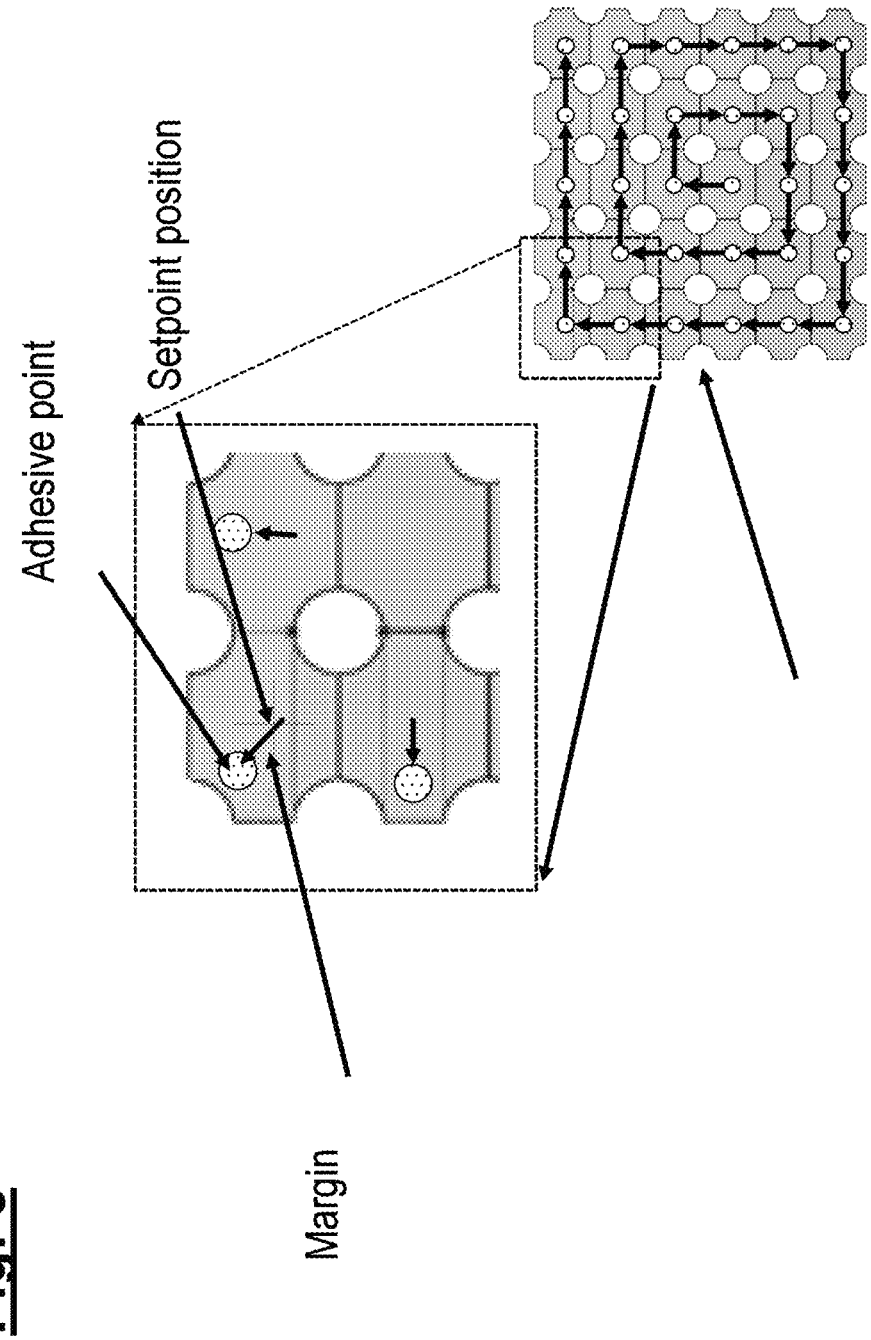
FIG. 6 shows a further schematic illustration for describing a further advantageous configuration of the method according to the invention.

In further embodiments, when applying the adhesive in FIG. 1D and step S450, it is also possible to take account of the respective oblique position or angular position of the relevant actuator surface at the respective position (that is to say to choose a suitable margin in the adhesive point position), with the consequence that the desired setpoint position of the adhesive point is established only after the adhesive has flowed in it in a manner governed by the respective oblique position. This is illustrated in FIG. 6. With the choice of the corresponding margin, the viscosity (preferably determined beforehand) of the adhesive is correspondingly taken into account.

Figure 7:
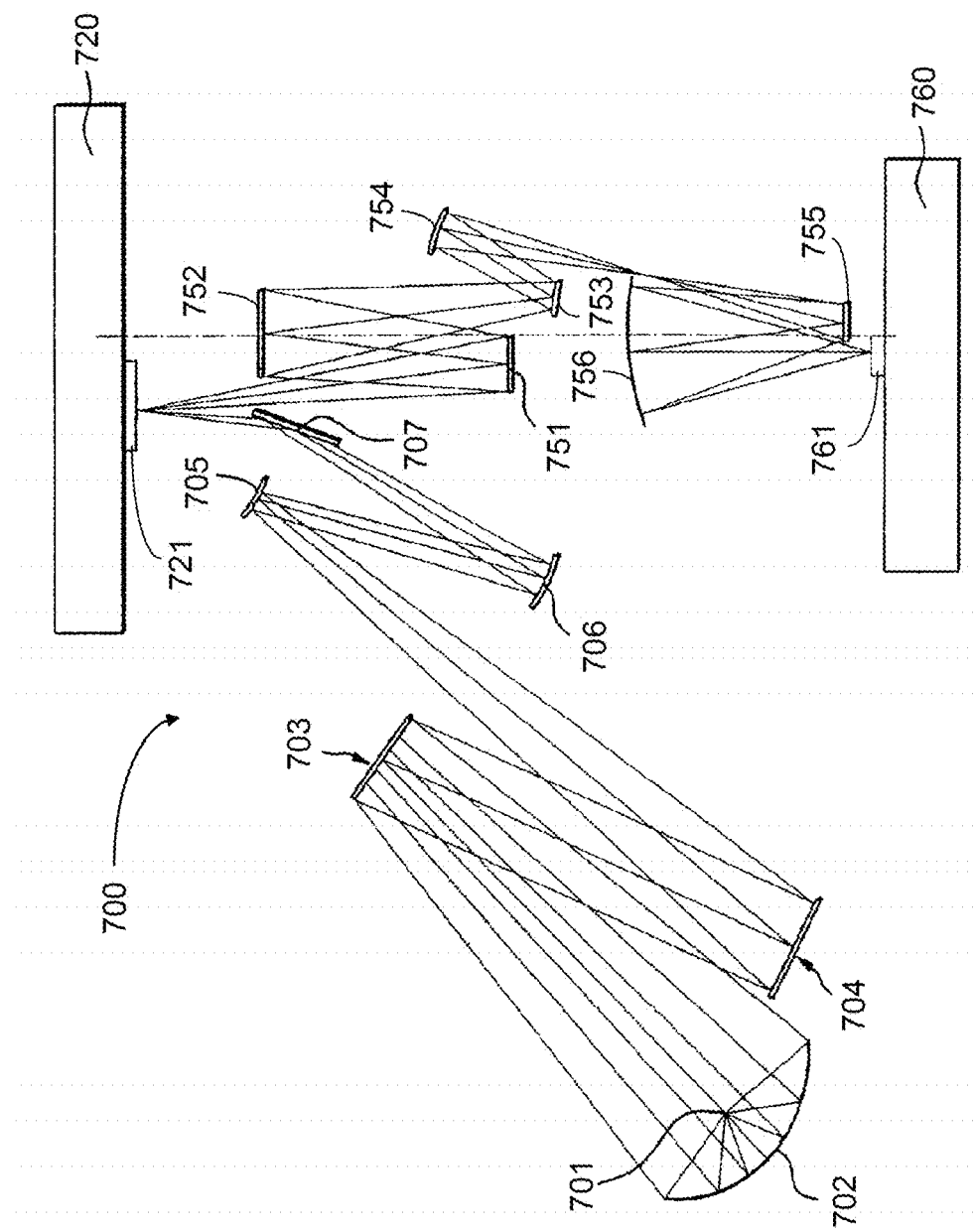
FIG. 7 shows a schematic illustration for describing a possible construction of a microlithographic projection exposure apparatus designed for operation in the EUV.

FIG. 7 shows a schematic illustration of an exemplary projection exposure apparatus which is designed for operation in the EUV and in which the present invention can be realized.

According to FIG. 7, an illumination device in a projection exposure apparatus 700 designed for EUV comprises a field facet mirror 703 and a pupil facet mirror 704. The light from a light source unit comprising a plasma light source 701 and a collector mirror 702 is directed onto the field facet mirror 703. A first telescope mirror 705 and a second telescope mirror 706 are arranged in the light path downstream of the pupil facet mirror 704. A deflection mirror 707 is arranged downstream in the light path, said deflection mirror directing the radiation that is incident thereon onto an object field in the object plane of a projection lens comprising six mirrors 751-756. At the location of the object field, a reflective structure-bearing mask 721 is arranged on a mask stage 720, said mask being imaged with the aid of the projection lens into an image plane in which a substrate 761 coated with a light-sensitive layer (photoresist) is situated on a wafer stage 760.

In further applications, the invention can also be realized in a projection exposure apparatus designed for operation in the DUV.

Figure 8:
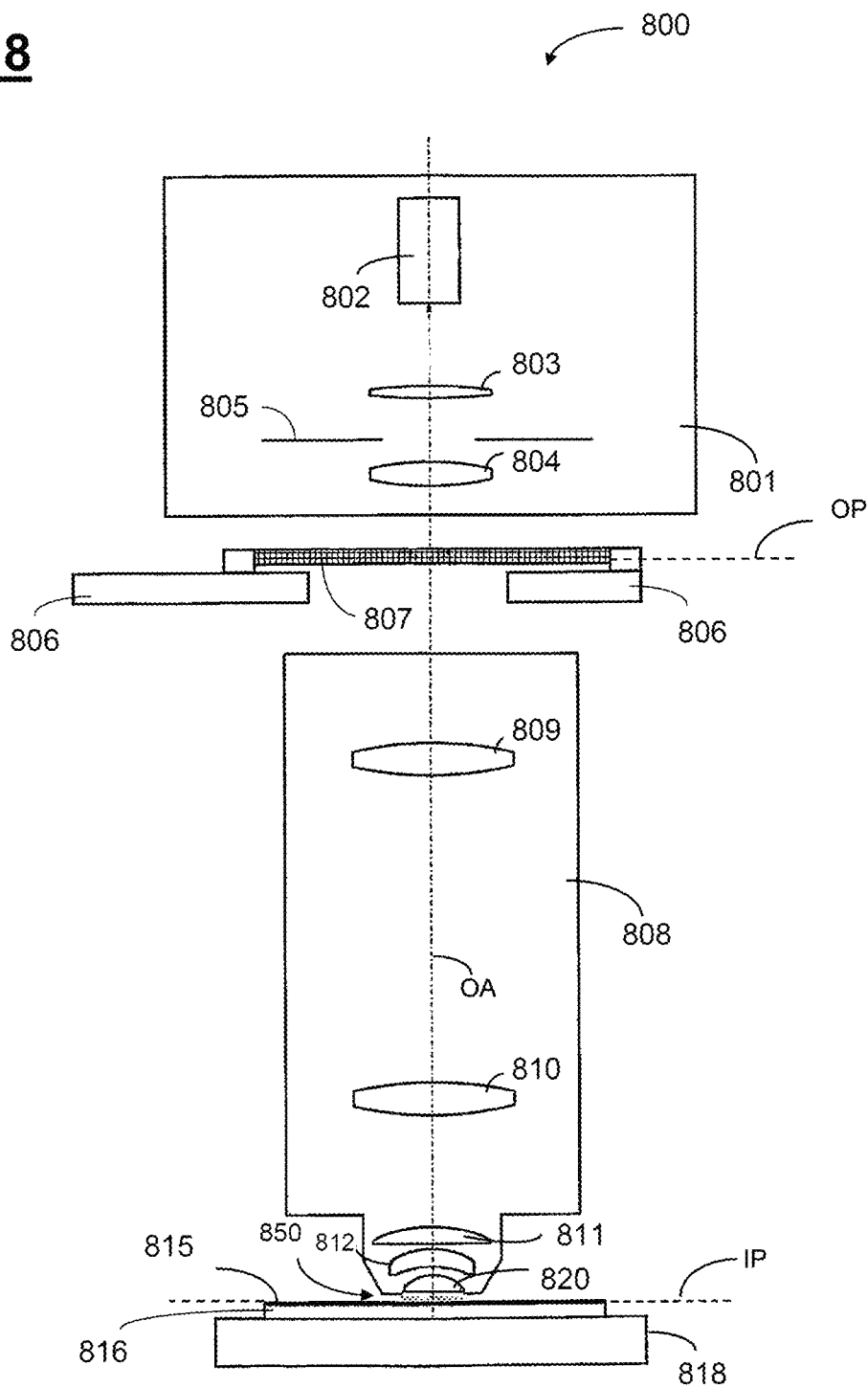
FIG. 8 shows a schematic illustration for describing a possible construction of a microlithographic projection exposure apparatus designed for operation in the DUV range.

FIG. 8 shows a schematic illustration of a further possible construction of a microlithographic projection exposure apparatus 800 which is designed for operation at wavelengths in the DUV range (for example approximately 193 nm) and likewise comprises an illumination device 801 and a projection lens 808.

The illumination device 801 comprises a light source 802 and an illumination optical unit symbolized in highly simplified fashion by lens elements 803, 804 and a stop 805. The operating wavelength of the projection exposure apparatus 800 in the example shown is 193 nm when using an ArF excimer laser as the light source 802. However, the operating wavelength can for example also be 248 nm when using a KrF excimer laser or 157 nm when using an $F_2$ laser as the light source 802. Between the illumination device 801 and the projection lens 808, a mask 807 is arranged in the object plane OP of the projection lens 808, said mask being held in the beam path by a mask holder 806. The mask 807 has a structure in the micrometre to nanometre range that is imaged, for example reduced by a factor 4 or 5, onto an image plane IP of the projection lens 808 with the projection lens 808. The projection lens 808 comprises a lens element arrangement by way of which an optical axis OA is defined, said lens arrangement likewise merely being symbolized in highly simplified fashion by lens elements 809 to 812.

A substrate 816, or a wafer, that has been provided with a light-sensitive layer 815 and positioned by way of a substrate holder 818 is held in the image plane IP of the projection lens 808. An immersion medium 850, which may be for example deionized water, is situated between the optical element 820 of the projection lens 808 that is located last on the image plane side and the light-sensitive layer 815.

What is claimed is:

1. Method for producing an adhesive bond between a first component and a second component for microlithography, wherein the second component is an optical element and wherein the method comprises:
   a) introducing the first component and the second component into a positioning device configured to change a relative position between the first component and the second component;
   b) calibrating a first relative position, in which a distance between the first component and the second component has a first value defining a predefined adhesive gap in forming the adhesive bond;
   c) calibrating a second relative position, in which a distance between the first component and the second component has a second value, which is greater than the first value, the second value indicating a start position in a relative adjustment of the first and second components;
   d) applying adhesive to the first component while the first component and the second component are at a distance from one another which is greater than the first value; and
   e) adjusting first component, starting at the start position, to the first relative position; and
   f) setting the first relative position while forming the adhesive bond between the first component and the second component;
   wherein both said calibrating of the first relative position and said calibrating of the second relative position are carried out before said applying of the adhesive to the first component.

2. Method according to claim 1, wherein said calibrating of the second relative position comprises measuring a position of a calibration element relative to the position of the first component that is temporarily brought into contact with a surface of the first component.

3. Method according to claim 2, wherein the calibration element has a geometry corresponding to a surface of the second component.

4. Method according to claim 1, wherein said calibrating of the first relative position and/or of the second relative position is carried out using at least one distance sensor.

5. Method according to claim 4, wherein the at least one distance sensor is an optical distance sensor.

6. Method according to claim 1, wherein said calibrating of the first relative position and/or of the second relative position comprises orienting the second component in six degrees of freedom.

7. Method according to claim 6, wherein said orienting of the second component is carried out using at least one mechanical stop present in the positioning device.

8. Method according to claim 1, wherein said calibrating of the first relative position and/or of the second relative position comprises lateral orienting of the first component.

9. Method according to claim 8, wherein said lateral orienting of the first component is carried out using at least one mechanical stop present in the positioning device.

10. Method according to claim 1, wherein the first component comprises a plurality of partial surfaces, wherein said applying of the adhesive comprises varying a metering of the adhesive for mutually different partial surfaces, taking account of an expected meniscus formation in edge regions of the respective partial surfaces.

11. Method according to claim 1, wherein said applying of the adhesive comprises positioning the adhesive, taking account of an expected angular position between the first component and the second component in an end position which is attained after the adhesive bond has been produced.

12. Method according to claim 1, wherein the first component is an actuator.

13. Method according to claim 1, wherein the second component is a mirror or a lens element.

14. Method for producing a microlithographic projection exposure apparatus comprising an illumination device and a projection lens, wherein the method comprises:
   producing an adhesive bond between a first component and a second component in the illumination device and/or in the projection lens with the method according to claim 1.

15. Method according to claim 14, wherein the first component is an actuator.

16. Method according to claim 14, wherein the second component is a mirror or a lens element.

\* \* \* \* \*